US009874896B2

(12) United States Patent
Botti

(10) Patent No.: US 9,874,896 B2
(45) Date of Patent: Jan. 23, 2018

(54) VOLTAGE-CURRENT CONVERTER, AND CORRESPONDING DEVICE AND METHOD

(71) Applicant: STMICROELECTRONICS S.R.L., Agrate Brianza (IT)

(72) Inventor: Edoardo Botti, Vigevano (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/226,568

(22) Filed: Aug. 2, 2016

(65) Prior Publication Data
US 2017/0212546 A1    Jul. 27, 2017

(30) Foreign Application Priority Data

Jan. 22, 2016   (IT) .................. 102016000006499

(51) Int. Cl.
*H03F 3/183* (2006.01)
*G05F 3/26* (2006.01)
*H03F 3/217* (2006.01)

(52) U.S. Cl.
CPC ............. *G05F 3/267* (2013.01); *H03F 3/183* (2013.01); *H03F 3/217* (2013.01); *H03F 2200/351* (2013.01)

(58) Field of Classification Search
CPC .......... G05F 3/267; H03F 3/183; H03F 3/217; H03F 2200/351
USPC ........ 327/108–112, 379, 389, 391, 530–546; 326/22–27, 81–87; 323/312–317
See application file for complete search history.

(56) References Cited

U.S. PATENT DOCUMENTS

| 4,804,926 A |   | 2/1989 | Woo |
|---|---|---|---|
| 5,051,847 A |   | 9/1991 | Philipps |
| 5,789,981 A | * | 8/1998 | Singer .................. H03F 3/3001 330/253 |
| 6,906,586 B2 | * | 6/2005 | Sakurai .............. H03F 3/45197 327/538 |
| 7,233,204 B2 | * | 6/2007 | Kim ..................... H03F 1/3211 330/253 |
| 7,368,989 B2 | * | 5/2008 | Luo ..................... H03F 3/45197 330/253 |

(Continued)

FOREIGN PATENT DOCUMENTS

| CN | 105207626 A | 12/2015 |
|---|---|---|
| EP | 0 316 999 A1 | 5/1989 |
| JP | 2000-124752 A | 4/2000 |

*Primary Examiner* — Brandon S Cole
(74) *Attorney, Agent, or Firm* — Seed IP Law Group LLP

(57) ABSTRACT

A voltage-current converter includes a first input stage and a second input stage with a first transistor and a second transistor driven by the first input stage and by the second input stage, respectively. First and second current generators are coupled to current lines of the first transistor and of the second transistor. At least one resistor couples the current lines of the first transistor and of the second transistor, where the ends of the aforesaid resistor are coupled to feedback terminals of the input stages so that an input voltage applied between voltage input terminals of the input stages is converted into a current on respective current output terminals of the converter. The converter includes switching circuits for coupling the first and second current generators alternately to the current line of the first transistor and to the current line of the second transistor.

17 Claims, 6 Drawing Sheets

(56) References Cited

U.S. PATENT DOCUMENTS

| | | | |
|---|---|---|---|
| 7,808,537 B2* | 10/2010 | Fujimura | H03F 3/08 348/300 |
| 8,953,346 B2* | 2/2015 | Cheng | G05F 1/561 323/316 |
| 2002/0136034 A1 | 9/2002 | Feldtkeller | |
| 2003/0058047 A1* | 3/2003 | Sakurai | H03F 3/45197 330/253 |
| 2005/0140445 A1* | 6/2005 | Kim | H03F 3/45188 330/258 |
| 2005/0180236 A1 | 8/2005 | Thiele et al. | |
| 2013/0027017 A1* | 1/2013 | Cheng | G05F 1/561 323/311 |
| 2013/0285715 A1 | 10/2013 | Wu et al. | |
| 2014/0084960 A1* | 3/2014 | Chen | H03K 5/22 327/64 |
| 2015/0130647 A1* | 5/2015 | Itakura | H03M 1/002 341/155 |
| 2015/0137855 A1* | 5/2015 | Wang | G05F 1/565 327/103 |

* cited by examiner

VOLTAGE-CURRENT CONVERTER, AND CORRESPONDING DEVICE AND METHOD

BACKGROUND

Technical Field

The present disclosure relates to voltage-current converters.

One or more embodiments may be used in power applications, for example in the audio sector.

Description of the Related Art

In some contexts, for example for audio amplifiers designed to drive speakers, it is useful to provide balanced voltage-current converters with the output that can be applied to transresistance power amplifiers, which, given that they present a voltage gain equal to 1, increase the loop gain, reducing amplification of the input offset.

In these systems, it is important for the output noise across the speaker to be contained (e.g., lower than 100 µV) and also for the offset to be low (e.g., lower than 50 mV).

An important parameter is moreover the precision of the voltage-current transfer, which in the audio field can be measured as total harmonic distortion (THD). It is desirable for THD to be lower than 0.1%.

A balanced voltage-current converter with low noise, low offset, and high precision may be useful in various contexts of application, in addition to power audio applications, referred to herein by way of example.

Notwithstanding the extensive activity of research and testing, there is today felt in the sector the need to provide improved voltage-current converters, for example in relation to the aspects outlined previously.

BRIEF SUMMARY

The claims form an integral part of the technical teachings provided herein in relation to the described embodiments.

One or more embodiments enable a fully differential voltage-current converter to be provided that is able to work with transresistance amplifiers with unity gain, with the converter that can be possibly turned off in order to zero the output current.

One or more embodiments may enable operation of a chopping type, which is able to compensate for mismatch.

In one or more embodiments, given that no important time constants are present, the chopping frequency may be chosen as corresponding to (i.e., identical to, approximately the same as, or at least comparable with) the high clock frequency of a PWM amplifier (a so-called class-D amplifier) with possibility of use as a fully differential transresistance amplifier.

BRIEF DESCRIPTION OF THE SEVERAL VIEWS OF THE DRAWINGS

One or more embodiments are now described, purely by way of non-limiting example, with reference to the annexed drawings, in which.

DETAILED DESCRIPTION

In the ensuing description, various specific details are illustrated in order to enable in-depth understanding of various examples of embodiments. The embodiments may be obtained without one or more of the specific details, or with other methods, components, materials, etc. In other cases, known structures, materials, or operations are not illustrated or described in detail so that the various aspects of the embodiments will not be obscured.

Reference to "an embodiment" or "one embodiment" in the framework of the present description is meant to indicate that a particular configuration, structure, or characteristic described in relation to the embodiment is comprised in at least one embodiment. Hence, phrases such as "in an embodiment" or "in one embodiment" that may be present in various points of the present description do not necessarily refer exactly to one and the same embodiment. Moreover, particular conformations, structures, or characteristics may be combined in any adequate way in one or more embodiments.

The references used herein are provided simply for convenience and hence do not define the sphere of protection or the scope of the embodiments.

Figure 1:
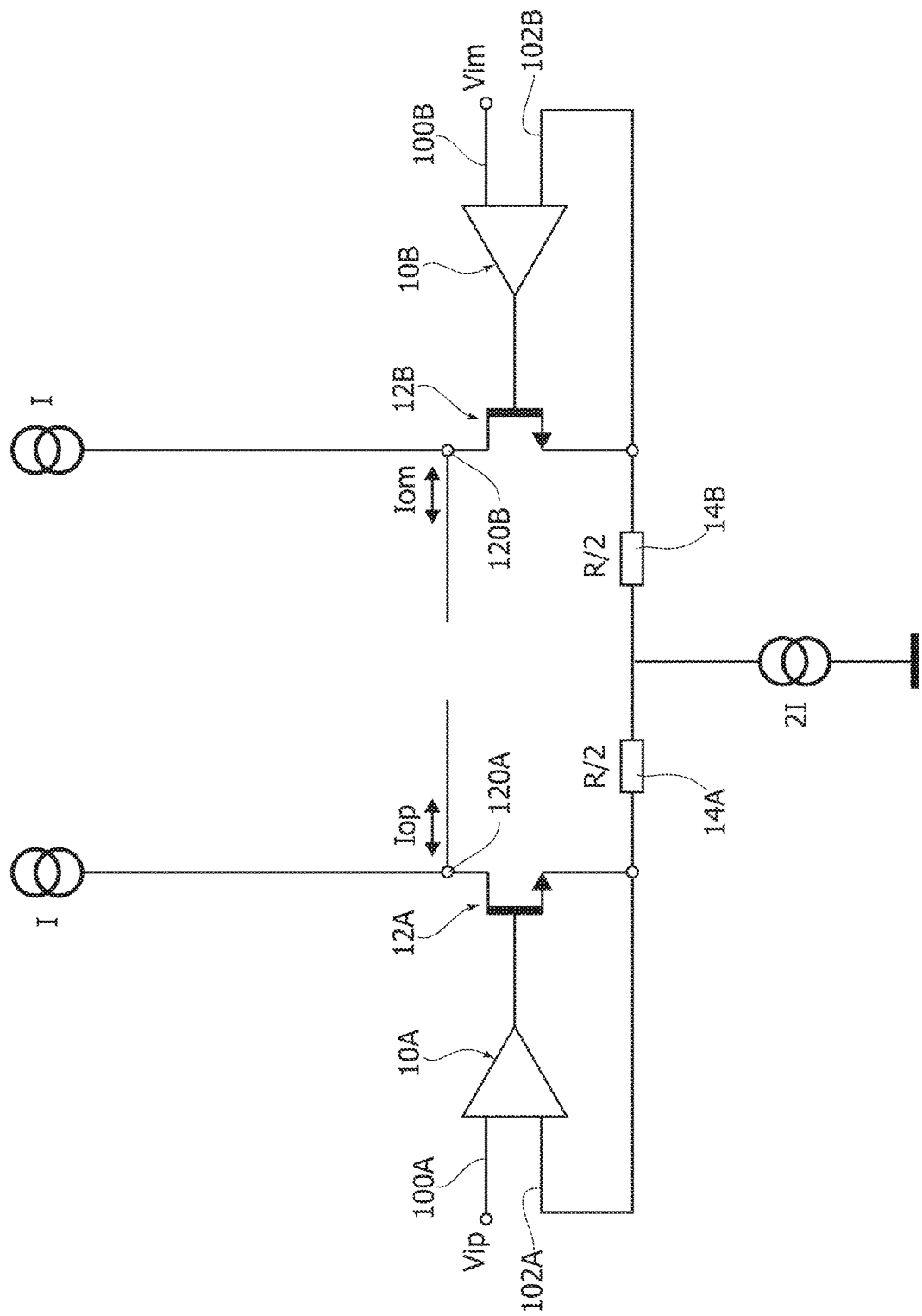
FIG. 1 is a schematic diagram of a differential voltage-current converter.

FIG. 1 presents a diagram of a differential voltage-current converter with input voltages Vip and Vim, each applied to a voltage input 100A, 100B, an input stage (e.g., a differential amplifier such as an operational amplifier, or op-amp) 10A, 10B designed to drive a respective transistor 12A, 12B (e.g., an FET, such as an NMOS).

The current lines (i.e., the source-drain path, in the case of FETs or the emitter-collector path, in the case of bipolar transistors) of the transistors 12A, 12B are set between respective ideal upper current generators I and an ideal of lower current generator 2I so as to generate respective output currents Iop and Iom, for example, at the drains, which have the function of output current terminals 120A, 120B.

On the opposite side, set between each transistor 12A, 12B and the lower generator 2I is a resistor 14A, 14B with a value of resistance R/2. The voltage across the resistor 14A, 14B that faces the respective transistor 12A, 12B is fed back to the other input 102A, 102B of the respective input stage 10A, 10B.

The current generators considered herein can be obtained by resorting to any solution known for the purpose (e.g., current mirrors or the like). In a differential voltage-current converter as illustrated in FIG. 1, the output current may be expressed as:

$$Iop = -Iom = (Vp - Vm)/R$$

Figure 2:
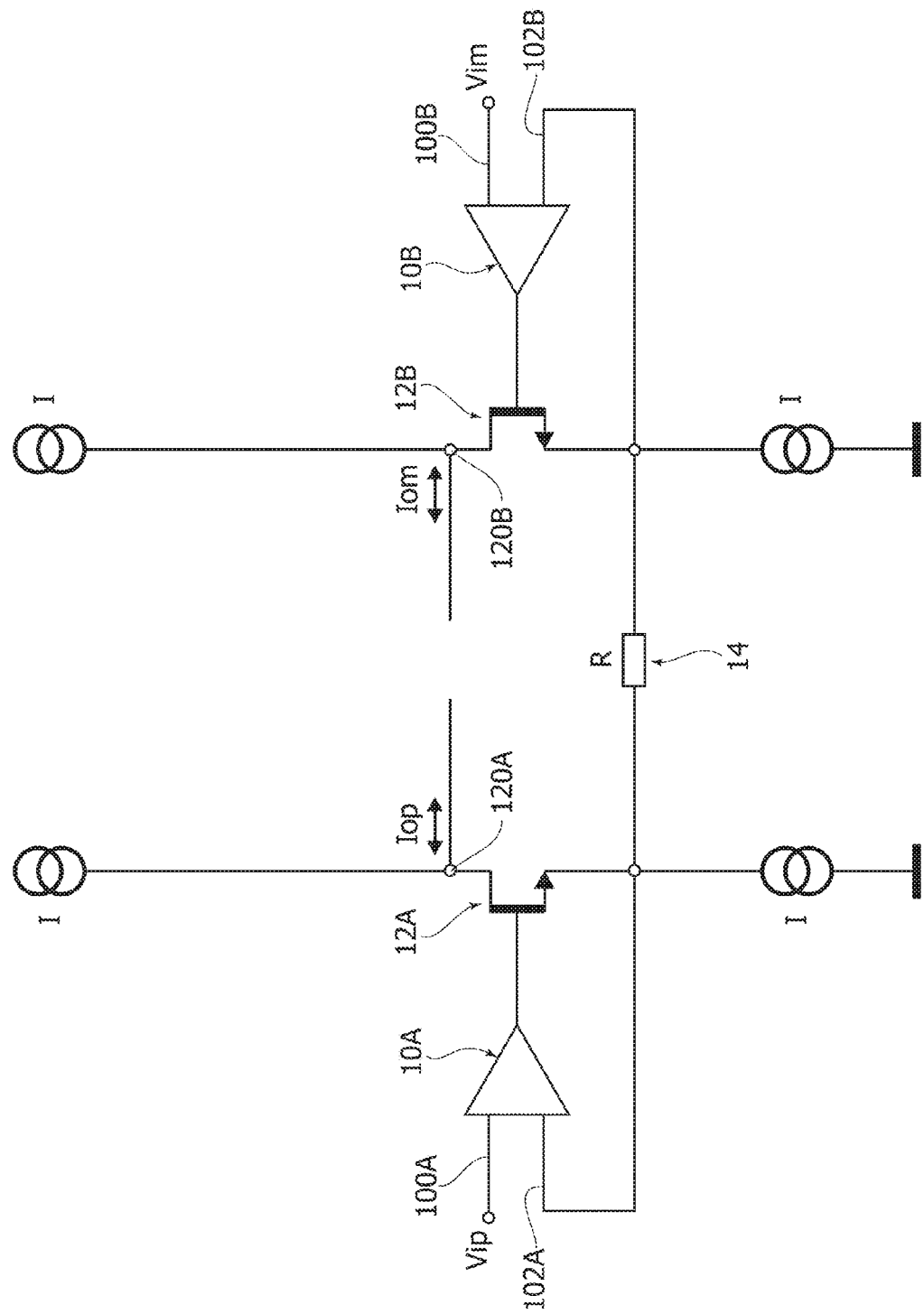
FIG. 2 is another schematic diagram of differential voltage-current converter.

The same relation applies in the case of the variant of FIG. 2 (where elements that are identical or similar to the ones already presented in FIG. 1 are designated by the same references, without them being described again for reasons of brevity), in which the lower generator current of FIG. 1 is split into two lower generators I, each associated to one of the transistors 12A, 12B, and the two resistors 14A, 14B of FIG. 1 are merged into a single (gain) resistor 14 with a value of resistance R, set straddling the current lines of the two transistors 12A, 12B.

Figure 3:
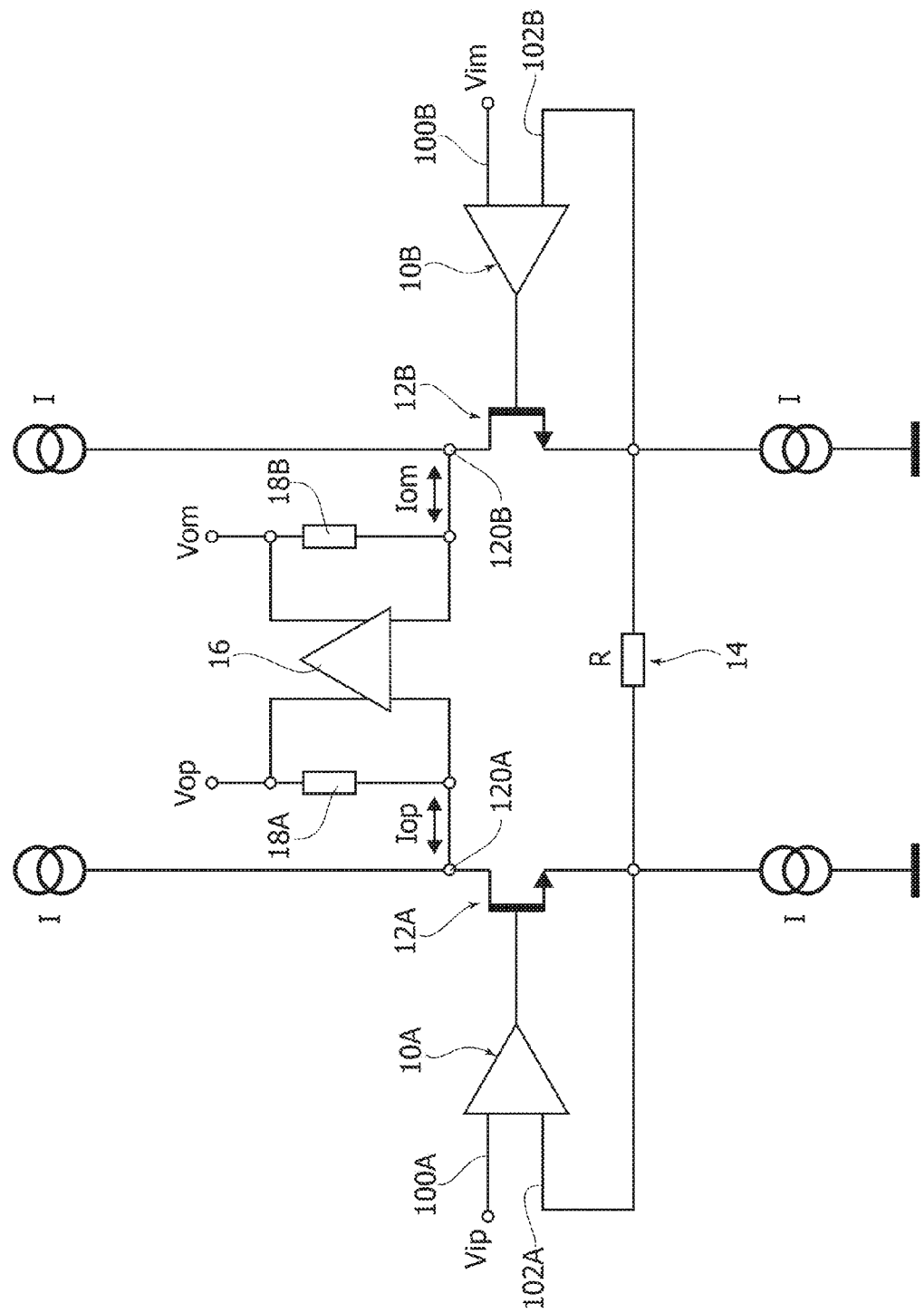
FIG. 3 exemplifies an application of a voltage-current converter with a transresistance amplifier with gain.

FIG. 3 presents a possible development of the solution presented in FIG. 2 (also here elements that are identical or similar to the ones already presented in the previous figures are designated by the same references, without them being described again for reasons of brevity), which exemplifies the possibility of coupling to the converter of FIG. 2 (the same may, on the other hand, apply also to the converter of FIG. 1) a transresistance amplifier 16 sensitive to the currents Iop and Iom, with provision of feedback resistors 18A, 18B (with values of resistance Rtp and Rtm), which act, respectively, between one of the outputs Vop, Vom of the amplifier 16 and a respective input of the amplifier 16 itself.

In this case, the following relation applies:

$$Vo/Ii = Rtp + Rtm$$

The maximum output swing, which can be obtained when the voltage-current converter stage is completely unbalanced, is given by:

$$Vo\max = (Rtp + Rtm) \cdot I$$

It is desirable for the output Vop, Vom to be able to reach a maximum swing equal to the maximum supply voltage. Consequently, the following relation may apply:

$$I/2 = Vdd(\max)/(Rtp + Rtm)$$

Considering, for example, Vdd(max)=20 V and Rtp=Rtm=100 kΩ, we have I=200 μA.

This means that a mismatch Δ(I) of a current generator of even just 1% may cause an offset at output Voff=Δ(I)·(Rtp+Rtm)/2=200 mV, which may be considerably higher than the specifications.

The level of output noise may prove even more problematical.

For instance, it is possible to have an output noise in the audio band that exceeds 2 mV, considerably higher than a desirable level that for example could be lower than 100 μV. It is reasonable to assume that the majority part of the noise is due to the current generators.

The THD of a system as exemplified previously (which is to be deemed as a whole known) respects a reasonable target, given that it falls in the region of 0.006%.

One or more embodiments may consequently abate noise and offset, without adversely affecting the result of the THD.

Figure 4:
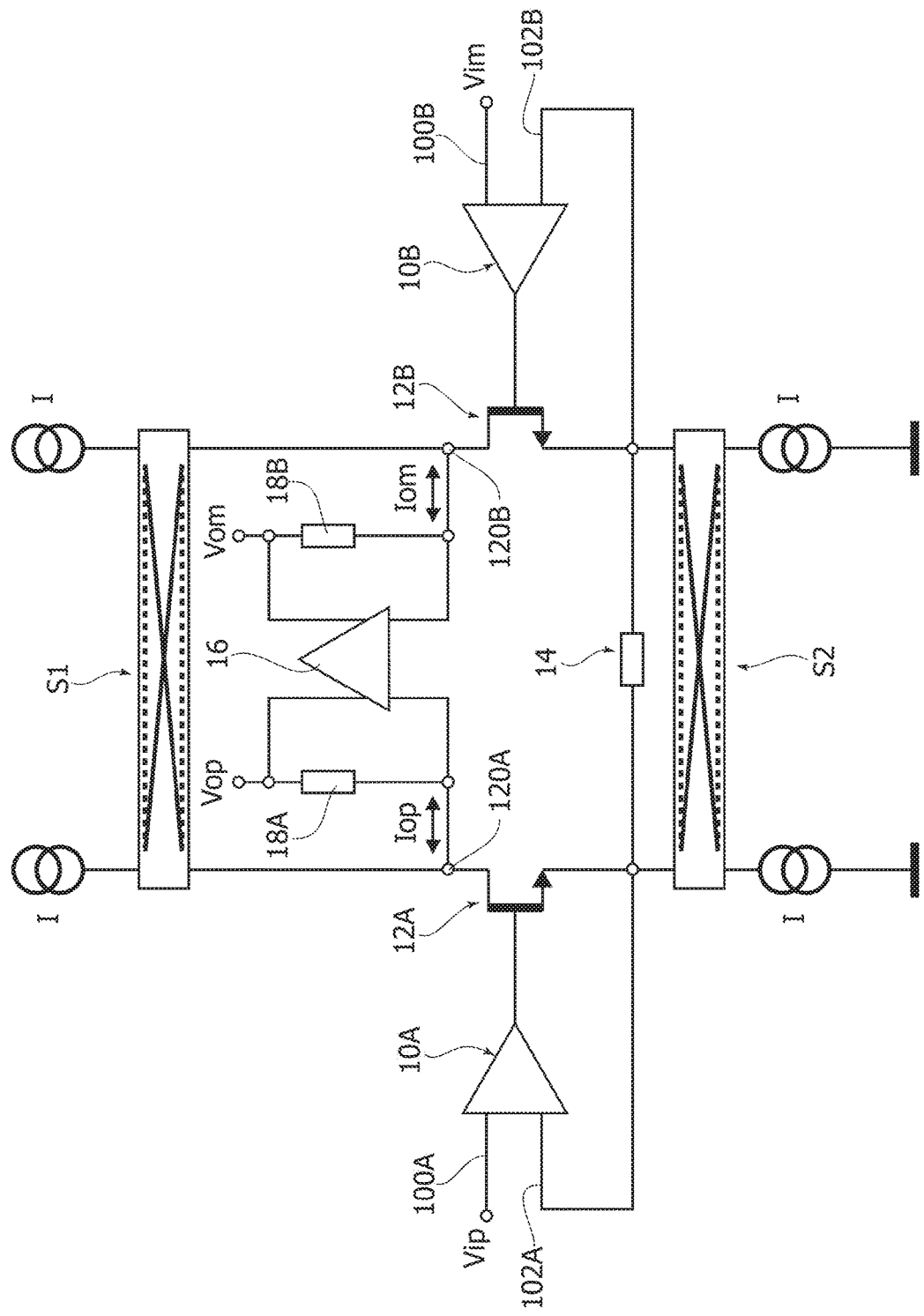
FIG. 4 is a schematic diagram of a differential voltage-current converter according to an example embodiment of the present disclosure.

One or more embodiments may for this purpose envisage intervening on the diagram of FIG. 3 (but the same may apply, for example, also to the diagram of FIG. 2) as exemplified in FIG. 4, i.e., coupling to the sources I (however obtained) switches—e.g., electronic switches—S1, S2, which switch the currents on the two branches of the system.

In other words, in one or more embodiments as exemplified in FIG. 4, the current of a certain source is no longer stably coupled either to the transistor 12A or to the transistor 12B, as occurs in the solutions seen previously.

In one or more embodiments (as exemplified in FIG. 4), the current of a certain source I (this can apply on both sides of the transistors, for example, both on the source side and on the drain side of the NMOSFETs 12A, 12B) is switched alternately between the transistor 12A and the transistor 12B.

In one or more embodiments, this mode of operation can give rise to an effect of averaging of the current such as to reduce (and virtually eliminate) offset and noise, in particular if the switching frequency is sufficiently high.

In one or more embodiments, the "chopper" system (i.e., the switches S1, S2), by acting in points at low capacitance, can work also at high frequencies, for example at values of around one or more megahertz.

In this way, the frequency at which the averaging effect is effective can be brought to values considerably higher than the audio band.

In order not to have an adverse effect on the levels of performance of THD, in one or more embodiments it is possible not to act on the path of the signal, for example, maintaining it as exemplified in the annexed FIGS. 1 to 3. On this path there may also be present non-negligible capacitances. If the latter are affected by the switching action, on account of the settling times, they could bring the minimum switching times to values not compatible with the desired high frequency.

A testing circuit for evaluating a structure as exemplified herein has shown, from d.c. to 20 kHz, a 60-dB reduction of the noise coming from the higher current generators, thus rendering the offset negligible and the noise level equivalent to that of a system with ideal generators, without negative effects on distortion.

Figure 5:
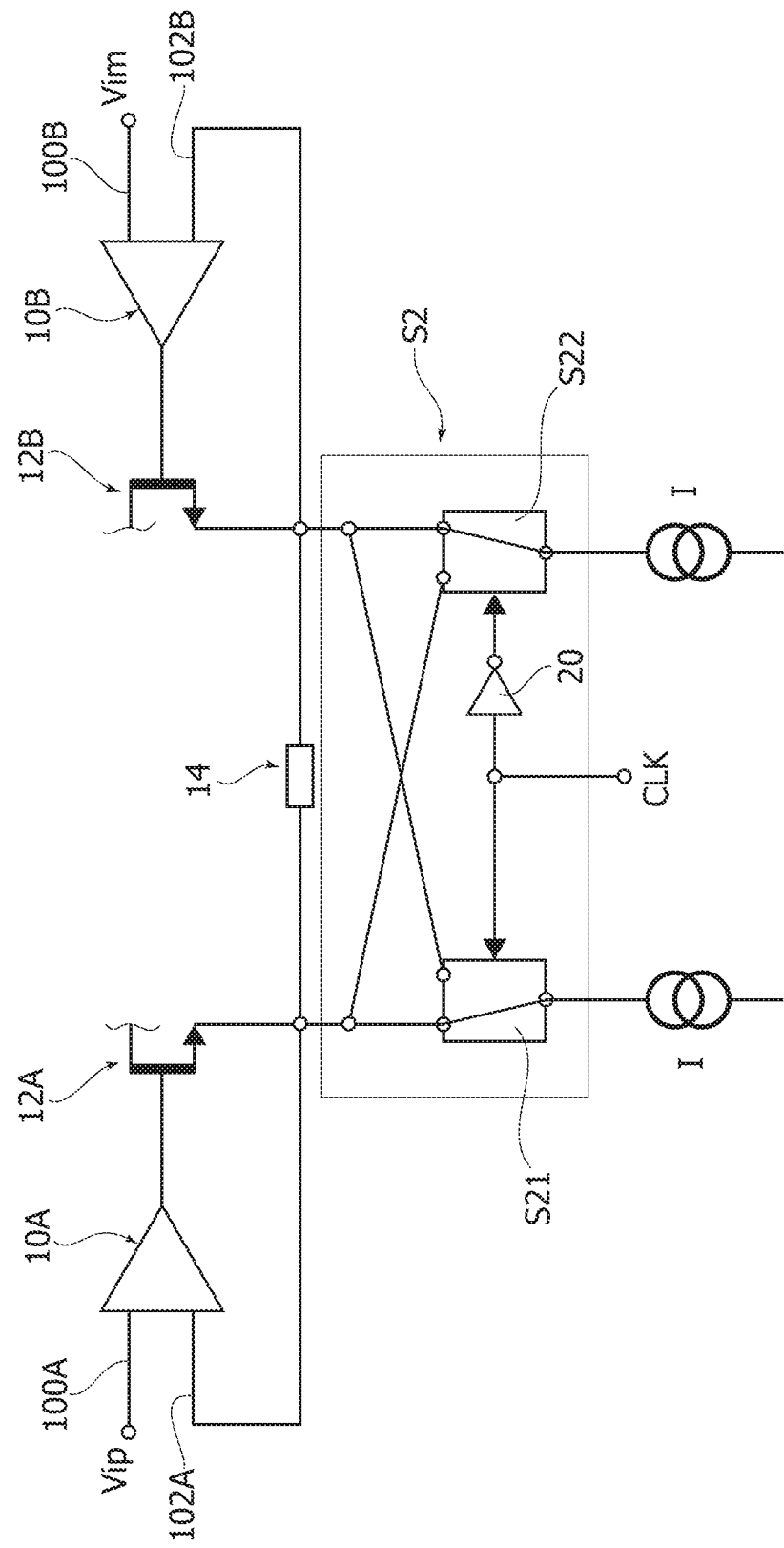
FIG. 5 exemplifies possible details of one embodiment of one of the electronic switches of FIG. 4.

FIG. 5 exemplifies in detail a possible embodiment of the switch module S2 that switches the generators I located on the "low" side of the transistors 12A, 12B, i.e., connected to ground, connecting alternately each current generator to one or other of the transistors 12A and 12B, for example, at the respective source terminals.

This is performed by operating in a crossed way, i.e., in such a way that:
one generator is connected to the transistor 12B, with the other generator connected to the transistor 12A;
and then, with the roles reversed:
the aforesaid one generator is connected to the transistor 12A, with the other generator connected to the transistor 12B,
and then, once again reversing the roles:
the aforesaid one generator is again connected to the transistor 12B, with the other generator again connected to the transistor 12A,
and so forth.

For instance the module S2 may comprise two single electronic switches S21, S22 driven in a complementary way starting from a clock input CLK, one of the two switches (e.g., the switch S22) being connected thereto with interposition of a logic inverter 20. The clock CLK thus determines the frequency at which the aforesaid exchange or reversal of roles is obtained.

A similar solution can be adopted for the switch module S1 that switches the generators I located on the opposite side (i.e., on the "high" side) of the transistors 12A, 12B to ground, connecting them alternately to one or the other of the transistors 12A and 12B, for example, at the respective source terminals.

For instance, the module S2 may comprise two single electronic switches S21, S22 driven in an alternative (complementary) way starting from a clock input CLK, one of the two switches (e.g., the switch S22) being connected thereto with interposition of a logic inverter 20.

In this way (or in other ways within the reach of the person skilled in the branch), it is possible to enable the first switch S21 and the second switch S22 to be switched in alternating sequence so that:
with the first current generator or generators coupled to the current line of the first transistor 12A, the second current generator or generators is/are coupled to the current line of the second transistor 12B; and
with the first current generator or generators coupled to the current line of the second transistor 12B, the second current generator or generators is/are coupled to the current line of the first transistor 12A.

Figure 6:
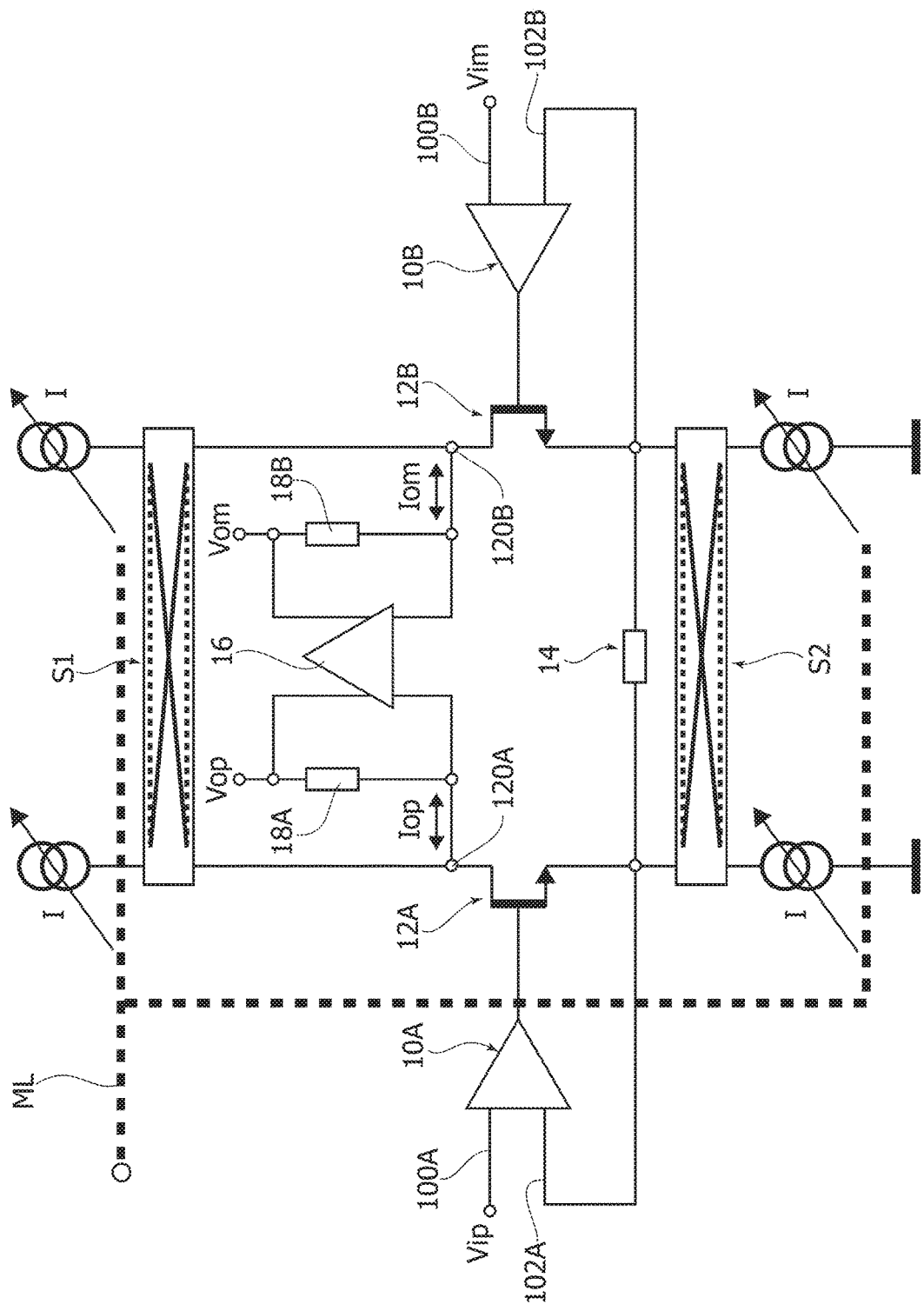
FIG. 6 illustrates a differential voltage-current converter including a muting function according to one or more additional embodiments of the present disclosure.

FIG. 6 exemplifies the fact that in one or more embodiments, as exemplified in FIG. 4, it is possible to provide for muting of the system by acting on the current generators I, setting to zero the value of current thereof, for example, by acting on a muting line ML.

It will moreover be appreciated how one or more embodiments can be implemented, for example, with MOSFETs of a P type, in a way complementary to what is illustrated in the figures.

It would seem possible to envisage a solution with bipolar transistors (BJTs), i.e., with the current line between emitter and collector (instead of between source and drain as in the case of FETs), it being necessary in the case of the bipolar transistors to take into account the error caused by the base current.

One or more embodiments can consequently regard a voltage-current converter, comprising:
  a first input stage (e.g., 10A) and a first transistor (e.g., 12A) driven by the first input stage, the first input stage having a first voltage input terminal (e.g., 100A) and a first feedback terminal (e.g., a voltage-feedback terminal 102A), wherein the first transistor has a first current line (e.g., the source-drain path in an FET or the emitter-collector path in a bipolar transistor) with a first current output terminal (e.g., 120A) on said first current line;
  a second input stage (e.g., 10B) and a second transistor (e.g., 12B) driven by the second input stage, the second input stage having a second voltage input terminal (e.g., 100B) and a second feedback terminal (e.g., a voltage feedback terminal 102B), wherein the second transistor has a second current line with a second current output terminal (e.g., 120B) on said second current line;
  at least one first current generator and at least one second current generator (upper generator and/or lower generator in the figures), which can be coupled to the current lines of the first transistor and of the second transistor; and
  at least one resistor (e.g., 14) for coupling the current lines of the first transistor and of the second transistor, where the end of said at least one resistor coupled to the current line of the first transistor is coupled to said first feedback terminal and the end of said at least one resistor coupled to the current line of the second transistor is coupled to said second feedback terminal, so that an input voltage (e.g., Vip, Vim) applied between said first and second voltage input terminals is converted into a current (e.g., Iop, Iom) at said first and second current output terminals,
  wherein the voltage-current converter comprises switching circuits (e.g., S1, S2) for coupling said at least one first current generator and said at least one second current generator alternately to the current line of the first transistor and to the current line of the second transistor.

In one or more embodiments, a converter may comprise a transresistance amplifier (e.g., 16) coupled to the first current output terminal of the first transistor and to the second current output terminal of the second transistor.

In one or more embodiments, there may be provided a first pair and a second pair of current generators, which can be coupled to the current lines of the first transistor and of the second transistor, each of the above pairs comprising current generators, which can be coupled to the current lines of the first transistor and of the second transistor on opposite sides of the respective transistor (respectively, at the top and at the bottom in the figures), where these switching circuits comprise first and second switching circuits (e.g., S1 and S2) for coupling the first pair and the second pair of current generators, which can be coupled alternately to the current line of the first transistor and to the current line of the second transistor.

In one or more embodiments, the switching circuits may comprise:
  a first switch (e.g., S21) having a first terminal coupled to said at least one first current generator and a first pair of terminals, which can be coupled alternately to the current lines of the first and second transistors; and
  a second switch (e.g., S22) having a second terminal coupled to said at least one second current generator and a second pair of terminals, which can be coupled alternately to the current lines of the first and second transistors;
  the first and second switches being switchable in sequence, alternating with one another, so that with said at least one first current generator coupled to the current line of the first transistor or the second transistor, said at least one second current generator is coupled to the current line of the second transistor or first transistor, respectively.

In one or more embodiments, the above switching circuits may comprise a clock input line (e.g., CLK) for clocking switching of the switching circuits.

One or more embodiments may comprise a muting input (e.g., ML) for zeroing the current of the at least one first current generator and at least one second current generator.

One or more embodiments may comprise an amplifier, optionally an audio amplifier, including a voltage-current converter as described previously.

In one or more embodiments, a method for operation of a converter as described previously may envisage:
  applying an input voltage (e.g., Vip, Vim) between said first and second voltage input terminals so that said input voltage is converted into a current (e.g., Iop, Iom) at said first and second current output terminals; and
  coupling said at least one first current generator and said at least one second current generator alternately to the current line of the first transistor and to the current line of the second transistor.

In one or more embodiments, such a method may comprise:
  coupling the voltage-current converter to a PWM amplifier operating at a certain clock frequency; and
  coupling said at least one first current generator and said at least one second current generator alternately to the current line of the first transistor (12A) and to the current line of the second transistor (12B) at an alternation frequency (CLK) corresponding to said certain clock frequency.

Without prejudice to the underlying principles, the details of construction and the embodiments may vary, even significantly, with respect to what is illustrated herein purely by way of non-limiting example, without thereby departing from the sphere of protection, which is defined by the annexed claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A voltage-current converter, including:
a first differential amplifier and a first transistor driven by the first differential amplifier, the first differential amplifier having a first voltage input terminal, a first feedback terminal, and an output, the first transistor including a control terminal coupled to the output terminal of the first differential amplifier and having a first current line directly connected to the first feedback terminal and including a first current output terminal;
a second differential amplifier and a second transistor driven by the second differential amplifier, the second differential amplifier having a second voltage input terminal, a second feedback terminal, and an output, the second transistor including a control terminal coupled to the output terminal of the second differential amplifier and having a second current line connected directly to the second feedback terminal and including a second current output terminal;
a first and a second current generator;
a resistive element having one end connected to the current line of the first transistor and an a second end connected to the current line of the second transistor, wherein an input voltage applied across the first and second voltage input terminals is converted into a current at the first and second current output terminals; and
switch circuitry coupled to the first and second current generators and to the first and second current lines, the switch circuitry configured to couple the first and the second current generators alternatively to the first current line of the first transistor and to the second current line of the second transistor.

2. The voltage-current converter of claim 1 further including a transresistance amplifier coupled to the first current output terminal of the first transistor and the second current output terminal of the second transistor.

3. The voltage-current converter of claim 1, wherein the first and the second current generators form a first pair of current generators and wherein the voltage-current converter further includes a second pair of current generators, the first and second pairs of current generators being coupleable to the first and second current lines of the first and second transistors, the first pair of current generators being coupleable to the first and second current output terminals and the second pair of current generators being coupleable to the first and second current lines of the first and second transistors on a side of the first and second current lines opposite the first and second current output terminals, and wherein the switch circuitry includes first and second switch circuitry for coupling the first pair and second pair of current generators alternatively to the first current line of the first transistor and to the second current line of the second transistor.

4. The voltage-current converter of claim 3, wherein the switch circuitry includes:
a first switch having a first port coupled to the first current generator and having a first pair of ports coupleable alternatively to the first and second current lines of the first and second transistors;
a second switch having a second port coupled to the second current generator and having a second pair of ports coupleable alternatively to the first and second current lines of the first and second transistors; and
wherein the first and second switches are switchable in an alternate sequence wherein, with the first current generator coupled to the first current line of the first transistor, the second current generator is coupled to the second current line of the second transistor.

5. The voltage-current converter of claim 4, wherein said switch circuitry includes an input clock line to clock switching of said switch circuitry.

6. The voltage-current converter of claim 5 further including a muting input for zeroing the current of said at least one first and at least one second current generator.

7. The voltage-current converter of claim 1 further including audio amplifier circuitry coupled to the voltage-current converter claim 1.

8. A voltage-current converter, comprising:
a first differential transistor and a second differential transistor, each of the first and second differential transistors including a control node and first and second signal nodes;
a resistive element connected between the first signal nodes of the first and second differential transistors;
a first constant current generator and a second constant current generator;
a first switching circuit coupled to the first and second differential transistors and to the first and second current generators, the first switching circuit configured to alternately couple the first constant current generator in series with the first differential transistor and the second constant current generator in series with the second differential transistor, and the first constant current generator in series with the second differential transistor and the second constant current generator in series with the first differential transistor;
a third constant current generator and a fourth constant current generator;
a second switching circuit coupled to the first and second differential transistors and to the third and fourth constant current generators, the second switching circuit configured to alternately couple the third constant current generator in series with the first differential transistor and the fourth constant current generator in series with the second differential transistor, and the third constant current generator in series with the second differential transistor and the fourth constant current generator in series with the first differential transistor;
a first differential amplifier configured to receive a first input voltage on a first input and having an output coupled to drive the control node of the first differential transistor responsive to the first input voltage, the first differential amplifier including a second input connected to the first signal node of the first differential transistor; and
a second differential amplifier configured to receive a second input voltage on a first input and having an output coupled to drive the control node of the second differential transistor responsive to the second input voltage, the second differential amplifier including a second input connected to the first signal node of the second differential transistor.

9. The voltage-current converter of claim 8, wherein the first switching circuit comprises:
a first switch circuit having a first node coupled to the first signal node the first differential transistor, a second node coupled to the first signal node the second differential transistor, a third node coupled to a reference supply voltage node, and a control node configured to receive a first control signal, the first switch circuit configured to couple either first node to the second node or the first node to the third node responsive to the first control signal; and a second switch circuit having a first node coupled to the first signal node of the first differential transistor, a second node coupled to the first signal node of the second differential transistor, a third node coupled to the reference supply voltage node, and a control node configured to receive a second control signal that is the complement of the first control signal, the second switch circuit configured to couple either first node to the second node or the first node to the third node responsive to the second control signal.

10. The voltage-current converter of claim 9, wherein the second switching circuit comprises:
a first switch circuit having a first node coupled to a second signal node the first differential transistor, a second node coupled to a second signal node the second differential transistor, a third node coupled to a supply voltage node, and a control node configured to receive the first control signal, the first switch circuit configured to couple either first node to the second node or the first node to the third node responsive to the first control signal; and
a second switch circuit having a first node coupled to the second signal node of the first differential transistor, a second node coupled to the second signal node of the second differential transistor, a third node coupled to the supply voltage node, and a control node configured to receive the second control signal, the second switch circuit configured to couple either first node to the second node or the first node to the third node responsive to the second control signal.

11. The voltage-current converter of claim 10, wherein the first control signal comprises a pulse width modulated signal and the second control signal comprises the complement of this pulse width modulated signal.

12. The voltage-current converter of claim 11 further comprising a transresistance amplifier having a first input coupled to the second signal node of the first differential transistor and a second input coupled to the second signal node of the second differential transistor, the transresistance amplifier configured to generate an output voltage across output nodes responsive to output currents received from the second signal nodes of the first and second differential transistors.

13. The voltage-current converter of claim 12, wherein both of the first and second differential transistors comprise a MOSFET transistor or both of the first and second differential transistors comprise a bipolar transistor.

14. The voltage-current converter of claim 13, wherein each of the first, second, third and fourth current generators comprises a variable current generator configured to receive a muting signal, each current generator configured to either provide a corresponding current or provide zero current responsive to the muting signal.

15. A method of controlling a voltage-current converter, the method comprising:
coupling a first signal node of a first transistor to either a first current generator or a second current generator responsive to a control signal;
coupling a first signal node of a second transistor to either the second current generator or the first current generator responsive to the control signal;
coupling a second signal node of the first transistor to either a third current generator or a fourth current generator responsive to the control signal;
coupling a second first signal node of the second transistor to either the third current generator or the fourth current generator responsive to the control signal;
generating a voltage across a resistive element connected between second signal nodes of the first and second transistors;
feeding back a first feedback voltage on the second signal node of the first transistor directly to an inverting input of a first operational amplifier;
feeding back a second feedback voltage on the second signal node of the second transistor directly to an inverting input of a second operational amplifier;
generating first and second input voltage signals on first and second outputs of the first and second operational amplifiers, respectively, in response to the first and second feedback voltages and in response to first and second input voltage signals supplied on non-inverting inputs of the first and second operational amplifiers, respectively;
applying the first and second input voltage signals to first and second control nodes of the first and second transistors, respectively; and
generating an output current signal based on current signals at the first signal nodes of the first and second transistors.

16. The method of claim 15, wherein coupling the first and second signal nodes of the first and second transistors to the first, second, third and fourth current sources comprises pulse width modulating the control signal.

17. The method of claim 16 further comprising muting the first, second, third and fourth current sources responsive to a muting signal to thereby set to zero a value of a current supplied by these current sources.

* * * * *